United States Patent
Cody et al.

(10) Patent No.: US 11,490,548 B2
(45) Date of Patent: Nov. 1, 2022

(54) STACKABLE FRAME AND SHIELD

(71) Applicant: Amphenol Tecvox, LLC, Madison, AL (US)

(72) Inventors: John T. Cody, Madison, AL (US); Steven F. Selby, Athens, AL (US); Scott M. Gelber, Athens, AL (US)

(73) Assignee: TECVOX, LLC, Madison, AL (US)

( * ) Notice: Subject to any disclaimer, the term of this patent is extended or adjusted under 35 U.S.C. 154(b) by 0 days.

(21) Appl. No.: 17/017,434

(22) Filed: Sep. 10, 2020

(65) Prior Publication Data

US 2022/0078952 A1   Mar. 10, 2022

(51) Int. Cl.
*H05K 9/00* (2006.01)
*H05K 1/02* (2006.01)

(52) U.S. Cl.
CPC ......... *H05K 9/0032* (2013.01); *H05K 1/0216* (2013.01); *H05K 9/0037* (2013.01)

(58) Field of Classification Search
CPC ............................ H05K 9/0032; H05K 9/0037
See application file for complete search history.

(56) References Cited

U.S. PATENT DOCUMENTS

| | | | | |
|---|---|---|---|---|
| 4,754,101 | A * | 6/1988 | Stickney | H05K 9/0032 174/383 |
| 5,354,951 | A * | 10/1994 | Lange, Sr. | H05K 9/0032 174/372 |
| 6,002,086 | A * | 12/1999 | Yajima | H05K 5/0021 174/373 |
| 6,181,573 | B1 * | 1/2001 | Riet | H05K 9/0032 361/816 |
| 6,194,655 | B1 * | 2/2001 | Lange, Sr. | H05K 9/0032 361/752 |
| 8,222,542 | B2 * | 7/2012 | Tseng | H05K 9/0032 174/382 |
| 10,045,468 | B2 * | 8/2018 | Seo | H05K 1/181 |
| 2002/0185294 | A1 | 12/2002 | Shlyakhtichman et al. | |
| 2007/0139904 | A1 | 6/2007 | English et al. | |
| 2010/0157566 | A1 * | 6/2010 | Bogursky | H01L 23/552 361/816 |
| 2017/0172019 | A1 * | 6/2017 | Kurz | H05K 9/0073 |
| 2017/0374769 | A1 * | 12/2017 | Vehkapera | H05K 9/0024 |

FOREIGN PATENT DOCUMENTS

| | | |
|---|---|---|
| EP | 0632686 A1 | 1/1995 |
| EP | 0866648 B1 | 9/1998 |

OTHER PUBLICATIONS

The Leading Source for EMI Shielding, Reliable Board, Enclosure and Cable Solutions, Leader Tech, a HEICO Company, www.leadertechinc.com; 4 pgs, undated.

(Continued)

*Primary Examiner* — Hung V Ngo
(74) *Attorney, Agent, or Firm* — Cantor Colburn LLP

(57) ABSTRACT

A frame includes a plurality of walls each having a first end and a second end facing away from each other along a first direction, and a plurality of spring fingers on the second end of one or more walls of the plurality of walls and extending along the first direction. First ends of the plurality of walls define an open bottom, and second ends of the plurality of walls define an open top.

21 Claims, 12 Drawing Sheets

(56) References Cited

OTHER PUBLICATIONS

Global Solutions: Local Support; Board Level Shields and Contacts; Laird Technologies, www.lairdtech.com; 26 pgs., undated.
ReCovr™, Removable Top Board-Level Shield; Laird Technologies, www.lairdtech.com, 2009, 1 page.
Anonymous; "Base retainer radio frequency"; Research Disclosure, Kenneth Mason Publications, Hampshire, UK, GB, vol. 348, No. 95, Apr. 1, 1993, XP007118960, ISSN: 0374-4353.
Extended European Search Report; European Application No. 21192070.7-1203; dated Feb. 3, 2022; 13 pages.

* cited by examiner

STACKABLE FRAME AND SHIELD

BACKGROUND

The disclosure relates generally to the field of electromagnetic shielding technology and more particularly to a stackable frame and a stackable shield.

Electromagnetic interference (EMI) is an electrical disturbance that can cause signal degradation in communication devices and media. Leader Tech (a HEICO company) offers a PCB shielded enclosure that forms a complete enclosure of an electronic component on a PCB and provides a shield for RF radiations. Laird offers board level shields to reduce crosstalk and interference.

SUMMARY

An aspect of this disclosure is a frame. The frame includes a plurality of walls each having a first end and a second end facing away from each other along a first direction, and a plurality of spring fingers on the second end of one or more walls of the plurality of walls and extending along the first direction. First ends of the plurality of walls define an open bottom, and second ends of the plurality of walls define an open top.

In some examples, a spring finger of the plurality of spring fingers includes a beam; a sloped ramp on the beam; and a detent at the beam and projecting inward with respect to the plurality of walls. In some examples, the spring finger of the plurality of spring fingers further includes a shift portion between the beam and a second end of a wall, providing a location shift for the beam and outward with respect to the plurality of walls. In some examples, the frame further includes one or more side beams extending from second ends of one or more walls of the plurality of walls and inward with respect to the plurality of walls.

In yet other examples, the frame further includes one or more stoppers on a second end of at least one wall of the plurality of walls, wherein each stopper of the one or more stoppers includes a stand and a plate on the stand and extending inward with respect to the plurality of walls. In some examples, the plate of each stopper of the one or more stoppers is in a same plane as the one or more side beams. In some examples, the plate of each stopper of the one or more stoppers and the one or more side beams are in different planes. In some examples, the frame further includes a latch hole in a side beam on a first wall of the plurality of walls; and a latch extending along the first direction and from a second wall opposing the first wall. In some examples, the latch includes a shift portion; a beam on the shift portion; and a sloped ramp on the beam and tilted inward with respect to the plurality of walls; wherein the shift portion provides a location shift for the beam and inward with respect to the plurality of walls. In some examples, the frame further includes a plurality of ventilation holes penetrating through the plurality of walls.

Another aspect of this disclosure is a shield. The shield includes a first frame and a second frame. The first frame includes a plurality of walls each having a first end and a second end facing away from each other along a first direction; and a plurality of spring fingers on second ends of one or more walls of the plurality of walls and extending along the first direction. The second frame includes a plurality of walls each having a first end and a second end facing away from each other along a first direction, wherein the first ends of the plurality of walls define an open bottom, and the second ends of the plurality of walls define an open top. The second frame interlocks with the first frame to form a singular enclosed space in the shield, with second ends of the plurality of walls of the second frame oriented toward second ends of the plurality of walls of the first frame.

In some examples, the shield further includes a first printed circuit board (PCB) having a first surface and a second PCB having a second surface, said first frame mounted to the first surface of said first PCB and said second frame mounted to the second surface of said second PCB, wherein the first surface faces the second surface. In some examples, a spring finger of the plurality of spring fingers of the first frame includes a beam; a sloped ramp on the beam; and a detent at the beam and projecting inward with respect to the plurality of walls. The detent of the first frame is in contact with a wall of the plurality of walls of the second frame.

In some examples, the spring finger of the plurality of spring fingers of the first frame further includes a shift portion between the beam and a second end of a wall of the first frame, providing a location shift for the beam and outward with respect to the plurality of walls. In some examples, the shield further includes one or more side beams extending from second ends of one or more walls of the plurality of walls of the first frame and inward with respect to the plurality of walls. In some examples, the shield further include one or more stoppers on a second end of at least one wall of the plurality of walls of the first frame, wherein each stopper of one or more stoppers includes a stand and a plate on the stand and extending inward with respect to the plurality of walls.

In some examples, the plate of each of the one or more stoppers is in a same plane as the one or more side beams. In some examples, the plate of each of the one or more stoppers and the one or more side beams are in different planes. In some examples, the shield further includes a latch hole in a side beam on a first wall of the plurality of the walls of the first frame; and a latch extending along the first direction and from a second wall of the first frame opposing the first wall. In some examples, the latch includes a shift portion, a beam on the shift portion; and a sloped ramp on the beam and tilted inward with respect to the plurality of walls of the first frame; wherein the shift portion provides a location shift for the beam and inward with respect to the plurality of walls of the first frame. In some examples, the frame further includes a plurality of ventilation holes penetrating through the plurality of walls of the first frame.

This summary is not intended to identify all essential features of the claimed subject matter, nor is it intended for use in determining the scope of the claimed subject matter. It is to be understood that both the foregoing general description and the following detailed description are exemplary and are intended to provide an overview or framework to understand the nature and character of the disclosure.

BRIEF DESCRIPTION OF THE FIGURES

The accompanying drawings are incorporated in and constitute a part of this specification. It is to be understood that the drawings illustrate only some examples of the disclosure and other examples or combinations of various examples that are not specifically illustrated in the figures may still fall within the scope of this disclosure. Examples will now be described with additional detail through the use of the drawings, in which.

DETAILED DESCRIPTION

Figure 1:
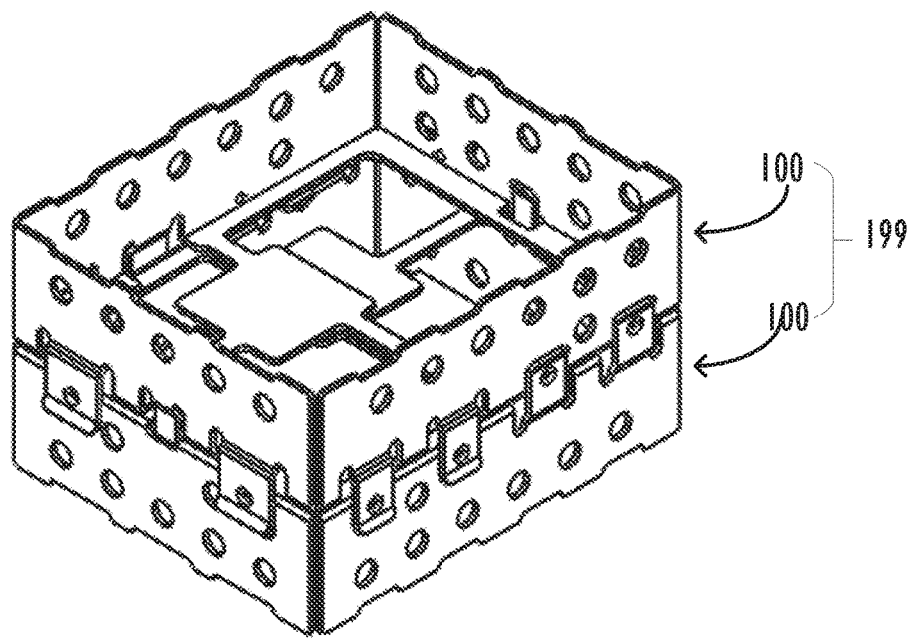
FIG. 1 illustrate a perspective view of an exemplary stackable shield including two identical stackable frames.

In describing the illustrative, non-limiting embodiments illustrated in the drawings, specific terminology will be resorted to for the sake of clarity. However, the disclosure is not intended to be limited to the specific terms so selected, and it is to be understood that each specific term includes all technical equivalents that operate in similar manner to accomplish a similar purpose. Several embodiments are described for illustrative purposes, it being understood that the description and claims are not limited to the illustrated embodiments and other embodiments not specifically shown in the drawings may also be within the scope of this disclosure.

The present disclosure provides a stackable frame and a stackable shield including one or more stackable frames. The stackable shield may be a stackable electromagnetic interference (EMI) shield for isolating electrical devices from their surroundings.

FIG. 1 illustrate a perspective view of an exemplary stackable shield including two identical stackable frames. The stackable frame 100 may be self-stackable, and accordingly, two identical frames 100 may be coupled to each other to form a stackable shield 199 and to form a singular enclosed space in the stackable shield 199. The two frames 100 join together and form a common ground for the two frames 100.

Figure 2A:
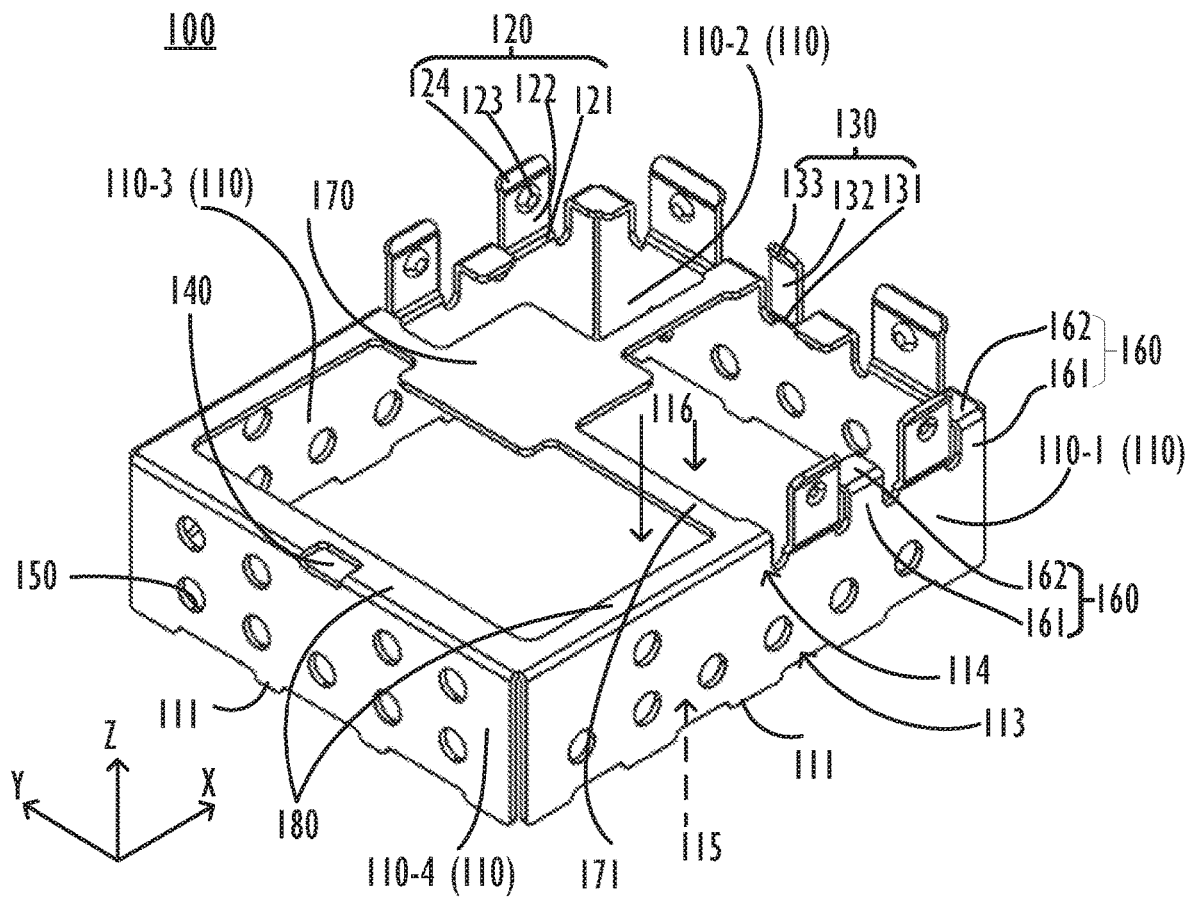
FIG. 2A illustrates a perspective view of the stackable frame shown in in FIG. 1.
Figure 2B:
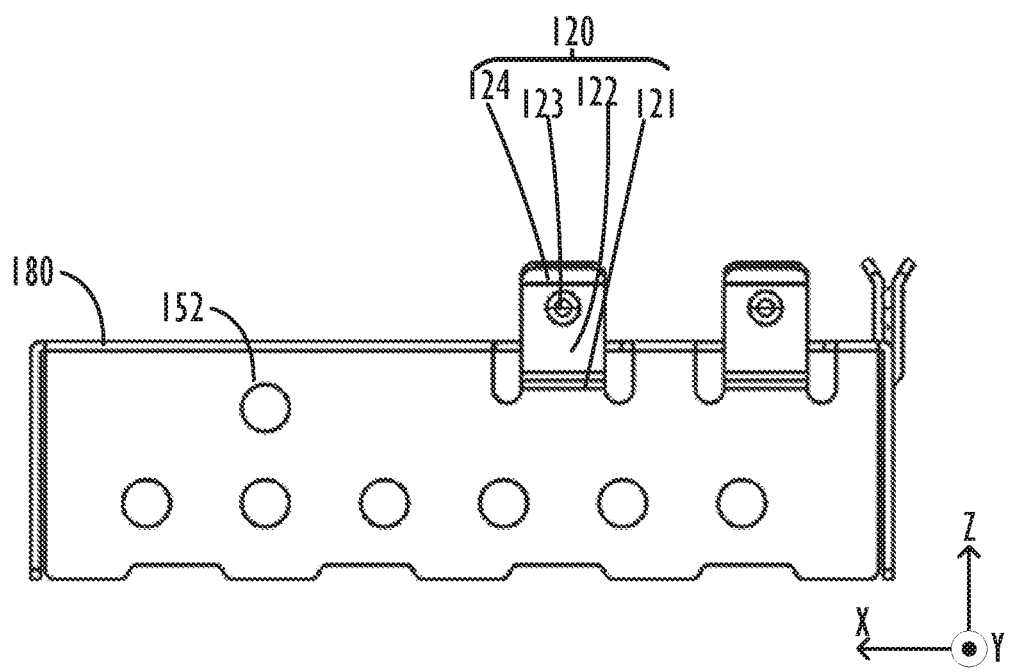
FIG. 2B illustrates a side view of the stackable frame shown in in FIG. 1.

FIG. 2A illustrates a perspective view of the stackable frame shown in in FIG. 1. FIG. 2B illustrates a side view of the stackable frame shown in in FIG. 1. A coordinate system is shown in FIGS. 2A and 2B, which includes X, Y, and Z axes. X axis is orthogonal to Y axis, and X and Y axes are in an X-Y plane. Z axis is orthogonal to the X-Y plane. The stackable frame 100 includes a plurality of walls 110, a plurality of spring fingers 120, a latch 130, a latch hole 140, a plurality of ventilation holes 150, a plurality of stoppers 160, and a pick spot 170.

Each of the plurality of walls 110 has a first end 113 and a second end 114, e.g., a bottom end and a top end. The first end 113 and the second end 114 face away from each other along Z axis. For example, the second end 114 is toward +Z direction along the Z axis, and the first end 113 is toward −Z direction along Z axis. The plurality of walls 110 includes, for example, four walls 110, including a right-side wall 110-1, rear wall 110-2, left-side wall 110-3, and front wall 110-4 (with respect to the embodiment as illustrated in FIG. 2A). Each wall 110 is rectangular in shape and substantially elongated with substantially linear longitudinal top and bottom edges and substantially linear transverse left- and right-side edges (in the embodiments shown). In one embodiment, the walls 110-1, 110-2, 110-3, and 110-4 all have the same height, the front and rear walls 110-4, 110-2 have the same length, and the side walls 100-1, 110-3 have the same length. In other embodiments, all of the walls 110-1, 110-2, 110-3, and 110-4 have the same length. In still further embodiments, the walls 110-1, 110-2, 110-3, and 110-4 have different heights and/or lengths.

The four walls 110-1, 110-2, 110-3, 110-4 are connected together at the side edges to form a rectangular or square frame 100 that has an open top and an open bottom and is relatively short in height to have a low profile. The first ends 113 of the plurality of walls 110 define at least one first opening 115, and the second end 114 of the plurality of walls 110 define at least one second opening 116. The first opening 115 defines the open top and the second opening 116 defines the open bottom.

The stackable frame 100 may further include a plurality of solder feet 111 at a first end 113 of each wall 110. More specifically, one or more feet 111 can extend outward (downward in the embodiments shown) from the bottom edge of one or more of the walls 110. The plurality of solder feet 111 may be coupled to a printed circuit board (PCB) by soldering. The plurality of spring fingers 120 are at the second ends 114 of the walls 110-1, 110-2, and 110-3. That is, one or more fingers 120 extend outward (upward in the embodiments shown) from the top edge of one or more of the walls 110.

The spring fingers 120 may be distributed in a way such that the stackable frame 100 can interlock with a second identical stackable frame turned, e.g., 180° from top to bottom. The spring finger 120 includes a shift portion 121, a beam 122, a detent 123, and a sloped ramp 124. The shift portion 121 is between and connects the wall 110 and the beam 122. The sloped ramp 124 is on the distal end of the beam 122. The shift portion 121 provides a location shift that is outward with respect to the plurality of walls 110, such that, in X-Y plane, the location of the beam 122 is shifted slightly outward with respect to the walls 110. With the shift portions 121, the spring fingers 120 of the stackable frame 100 may surround respective outside surfaces of walls 110 of another identical stackable frame 100, as the two stackable frames 100 interlock with each other.

The detent 123 is a round tab or button that is formed at the inner or inwardly facing surface of the beam 122. The detent 123 projects inward with respect to the walls 110, e.g. toward the inner space with respect to walls 110. In addition, one or more lock holes 152 (FIG. 2B) are positioned about the upper portion of one or more of the walls. The lock holes 152 are set back from the upper and/or lower edge and are aligned with a respective detent 123 of another frame to be mated.

The detents 123 of the stackable frame 100 may be in contact with the walls 110 of another stackable frame 100, as the two stackable frames 100 interlock with each other. As the two stackable frames 100 interlock with each other, the two stackable frames 100 forms a common ground for the stackable shield 199. The sloped ramp 124 is on the beam 122, and is tilted outward with respect to the walls 110. With the guide of the sloped ramps 124, the spring fingers 120 of the stackable frame 100 may smoothly couple with respective walls 110 of another identical stackable frame 100, as the two stackable frames 100 interlock with each other.

Thus, the shift 121 and ramp 124 each facilitate mating of the two frames 100 and prevents stubbing of the fingers 120 with the respective edge of the mating frame. That is, the shift 121 positions the finger 120 slightly outside of the walls, and the finger 120 can optionally be parallel to the wall 110 or angled slightly inward toward the wall 110. As two frames 100 are brought together, the ramp 124 guides the frame with respect to the other mating frame, thereby pushing the finger 120 slightly outward so that the finger 120 slides over the outer surface of the mating fame and has an inward spring bias to form a reliable contact with the wall, as shown in FIG. 1. The fingers 120 can be biased to press inward onto the mating frame in the joined configuration, and the shift portion 121 move the fingers 120 outward as the two mating frames 100 come together. The frames 100 can then continue to slide together. Once the two frames 100 are completely brought together, the inward spring bias of the fingers 120 forces the detents 123 inwardly into the respective lock holes 152. That operation locks and engages the two frames 100 to one another. To release the frames, the user can reach under the ramp 124 and pull the fingers outward slightly until the fingers are out of the lock holes 152, and at the same time pull the frames apart until the fingers are clear of the lock holes.

The latch 130 may extend along Z axis from the wall 110-2. For example, one or more latches 130 can project outward (upward in FIG. 2A) from the top edge of the wall, and positioned between respective fingers 120. The latch 130 may include a shift portion 131, a beam 132 on the shift portion 131, and a sloped ramp 133 on the beam 132 and tilted inward with respect to the walls 110. The shift portion 131 is between and connects the wall 110-2 and the beam 132. The shift portion 131 provides a shift that is inward with respect to the plurality of walls 110, such that, in X-Y plane, the beam 132 is shifted inward with respect to the walls 110.

The latch hole 140 may be in a side beam (e.g., a lid) 180 at the wall 110-4. Cross support members or side beams 180 may extend from second ends of one or more of the walls 110 toward space inside the walls 110. The latch 130 and the latch hole 140 may be over two opposing walls 110-2 and 110-4, respectively. The latch 130 of the stackable frame 100 mates with a latch hole 140 of another identical stackable frame 100, as the two stackable frames 100 interlock with each other. With the sloped ramp 133, the latch 130 of the stackable frame 100 may insert smoothly into a latch hole 140 of another identical stackable frame 100, as the two stackable frames 100 interlock with each other. The plurality of ventilation holes 150 are formed in the walls 110 and penetrating through the walls 110 for ventilation from electronic components (not shown in FIG. 2) in the enclosed space of the stackable shield 199.

The stopper 160 includes a stand 161 and a plate 162. The stand 161 extends outward from the top edge of the wall, and the plate 162 is at the distal end of the stand 161, and extends orthogonally inward with respect to the walls 110 and the stand 161. The plate 162 and the side beam 180 may be in a same plane, e.g., in a same X-Y plane. The plates 162 of the stackable frame 100 may be in contact with side beams 180 of another identical stackable frame 100 and stop the two stackable frames 100 from moving deeper into each other, as the two stackable frames 100 interlock with each other.

In one example, the stopper 160 is at a wall 110, such as wall 110-1, and the stand 161 is a beam extending along the Z axis. In another example, the stopper 160 may be across a boundary between two adjacent walls 110, such as walls 110-1 and 110-2, and the stand 161 may include two beams extending along Z axis and forming a right angle between each other. Where multiple fingers 120, latches 130, and/or stoppers 160 are provided, they can form an alternating pattern of fingers 120 with either latches 130 or stoppers 160.

The stackable frame 100 may optionally further include a pick spot 170 for auto-placement during surface mount technology (SMT) process. The pick spot 170 may be coupled to one or more of the walls 110 via connection beams 171. The pick spot 170 and connection beams 171 are located in such a way that they avoid interfering with internal electrical components contained within the shielded area. Free space may be increased to reduce part weight and to permit any tall components inside to reach in Z axis above the height of the beam. The exact position, height, and number of such internal electrical components varies from one application to another. The pick spot 170 is located on or very near to the center of gravity of the whole piece in X and Y direction, such that the pick-and-place nozzle is aligned with the center of gravity in Z-axis, in order to stay level when lifted. The connection beams 171 may be reduced in size and number, but also support the weight and stress of handling and placing the entire structure from its pick spot 170 without damage or excessive deflection of the structure.

Figure 3:
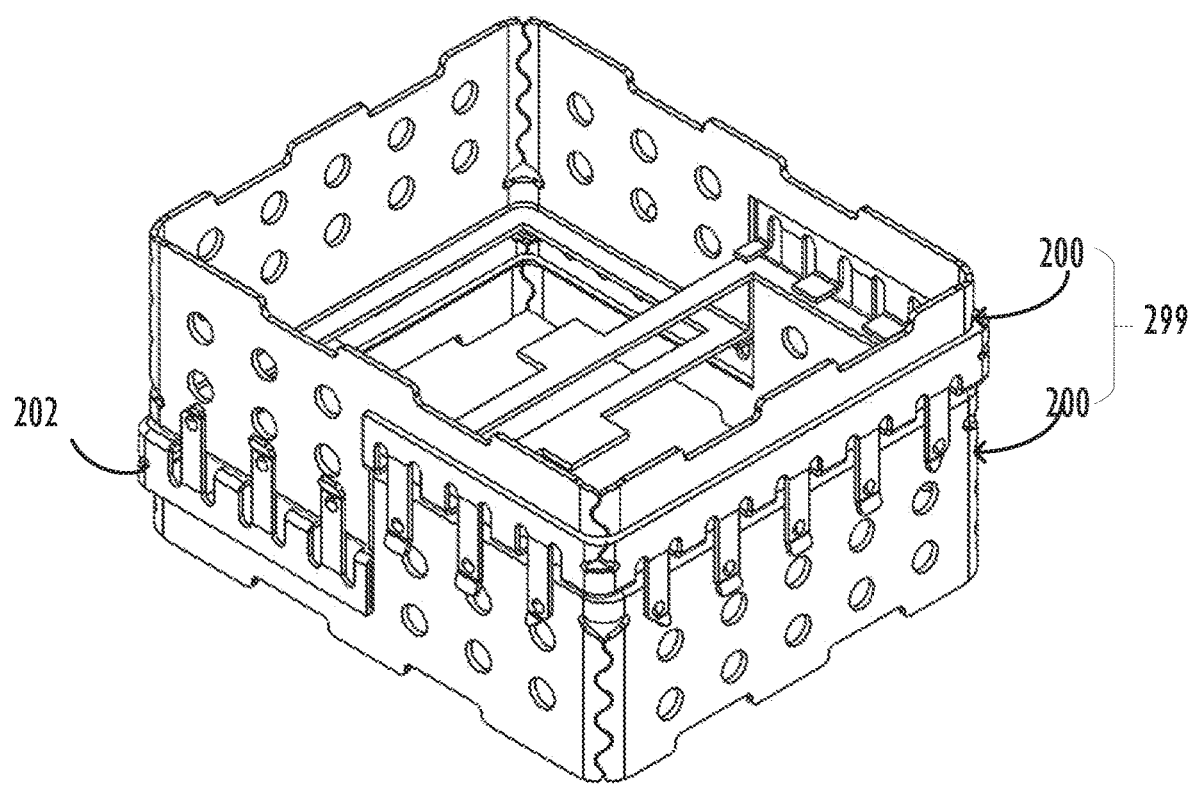
FIG. 3 illustrate a perspective view of another exemplary stackable shield including two identical stackable frames.

FIG. 3 illustrate a perspective view of another exemplary stackable shield including two identical stackable frames. The stackable frame 200 may be self-stackable, and accordingly, two identical frames 200 may be coupled to each other to form a stackable shield 299 and to form a singular enclosed space in the stackable shield 299. The two frames 200 join together and form a common ground for the two frames 200.

Figure 4:
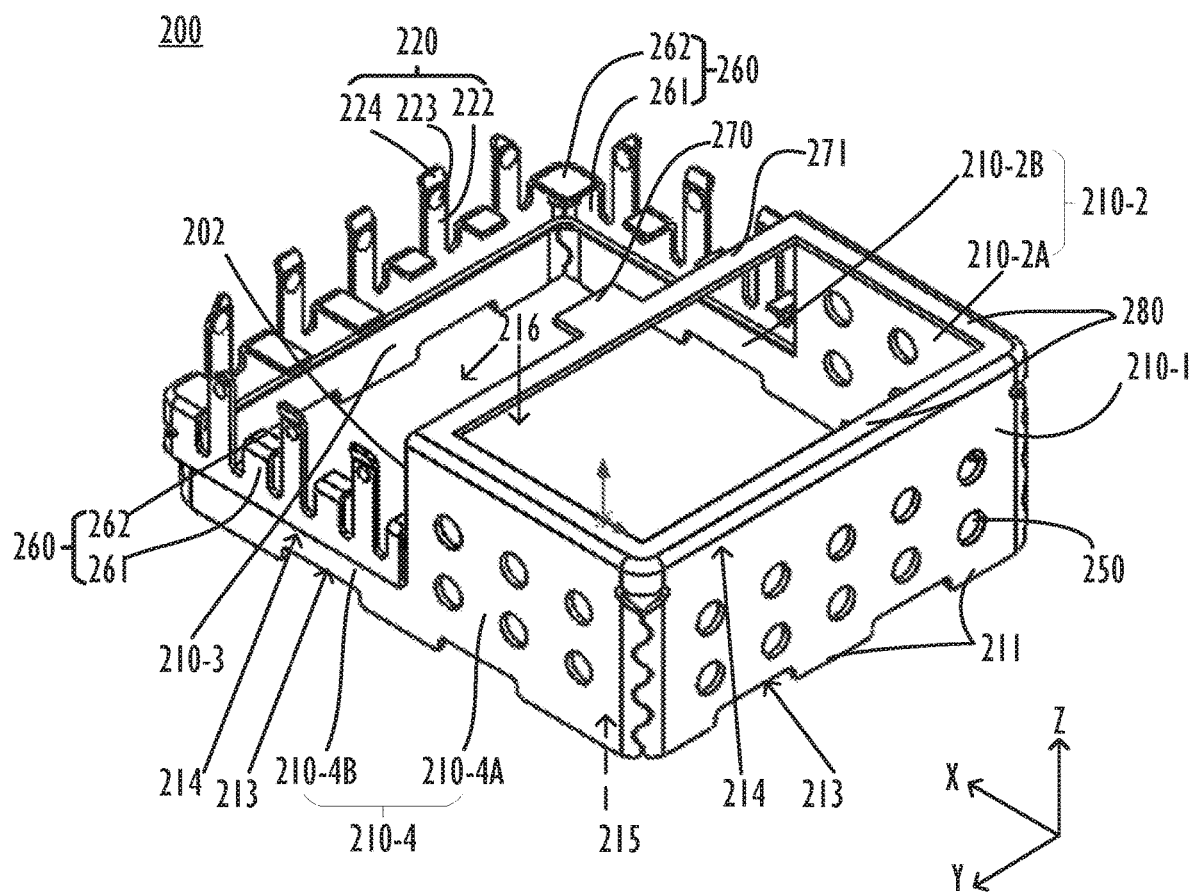
FIG. 4 illustrates a perspective view of the stackable frame shown in FIG. 3.

FIGS. 3, 4 further illustrates that the walls 200 need not have one uniform height and/or length. Rather, as shown, the walls can have a taller portion 210-4A and a shorter portion 210-4B with a ledge or step 204 therebetween, and the taller portion of one frame mates with the shorter portion of a mating frame. In addition, the fingers and/or latches need not be integrally formed with the walls (as in FIGS. 1-2), but instead can be formed on a separate plate 202 that is attached to the top/bottom edge of the wall 200. And the fingers and/or latches need not be provided on both mating frames, but can be formed only at one of the frames.

Figure 5:
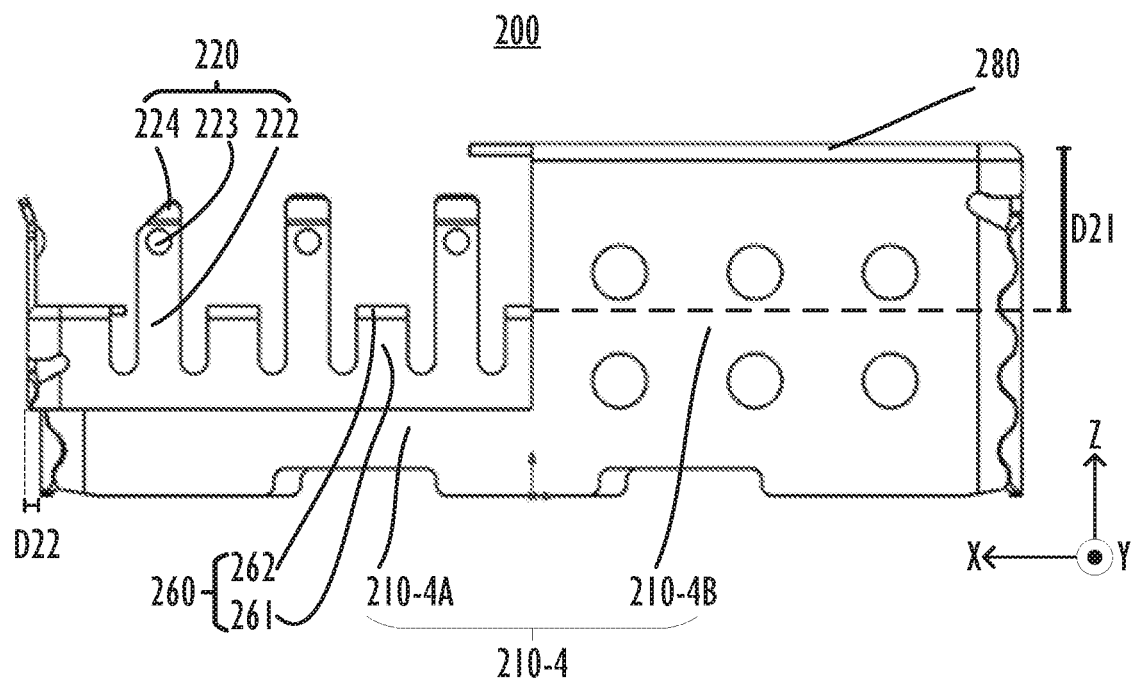
FIG. 5 illustrates a side view of the stackable frame shown in FIG. 3.
Figure 6:
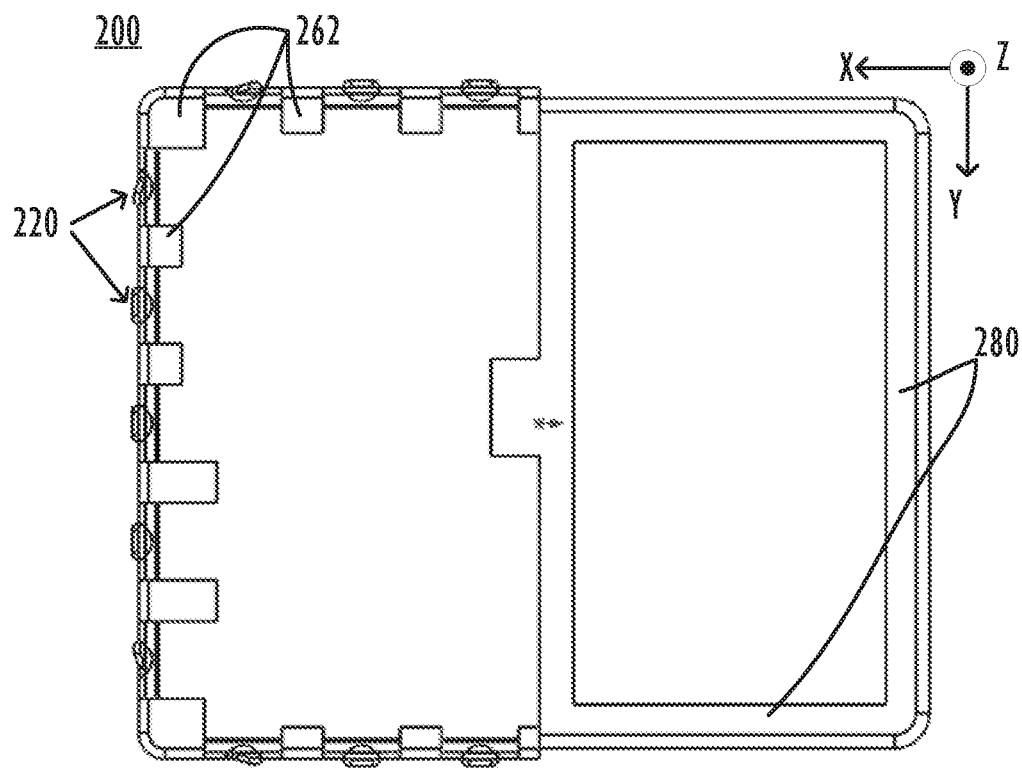
FIG. 6 illustrates a top view of the stackable frame shown in FIG. 3.

FIG. 4 illustrates a perspective view of the stackable frame shown in FIG. 3. FIGS. 5 and 6 illustrate a side view and a top view of the stackable frame shown in FIG. 3, respectively. Referring to FIGS. 4-6, the stackable frame 200 includes a plurality of walls 210-1, 210-2, 210-3, and 210-4, a plurality of spring fingers 220, a plurality of ventilation holes 250, a plurality of stoppers 260, and a pick spot 270.

The plurality of walls 210-1, 210-2, 210-3, and 210-4 can also be collectively referred to as walls 210. The wall 210-2 includes a wall portion 210-2A and a wall portion 210-2B, and a height of wall portion 210-A is greater than a height of wall portion 210-B. The wall 210-4 includes a wall portion 210-4A and a wall portion 210-4B, and a height of wall portion 210-4A is greater than a height of wall portion 210-4B.

A wall 210 may include a first end 213 and a second end 214, e.g., a bottom end and a top end. The first ends 213 of the plurality of walls 210 surround at least one first opening 215, and the second ends 214 of the plurality of walls 210 surround at least one second opening 216.

The stackable frame 200 may further include a plurality of solder feet 211 at a first end of each wall 210. The plurality of solder feet 211 may be coupled to a printed circuit board (PCB) by soldering. The plurality of spring fingers 220 are on the second ends of wall 210-3 and wall portions 210-2B and 210-4B.

The spring fingers 220 may be distributed in a way such that the stackable frame 200 can interlock with a second identical stackable frame turned, e.g., 180° from top to bottom. The spring finger 220 may include a beam 222, a detent 223, and a sloped ramp 224.

The detent 223 is formed at the beam 222, and projects inward with respect to the walls 210, e.g. toward the inner space with respect to the walls 210. The sloped ramp 224 is on the beam 222, and is tilted outward with respect to the walls 210, e.g., toward the space outside with respect to walls 210. With the guide of the sloped ramps 224, the spring fingers 220 of the stackable frame 200 may smoothly couple with respective walls 210 of another identical stackable frame 200, as the two stackable frames 200 interlock with each other.

The stackable frame 200 may further include side beams 280 extending from second ends of wall 210-1 and wall portions 210-2A and 210-4A, toward space inside the walls 210. The plurality of ventilation holes 250 are formed in wall 210-1 and wall portions 210-2A and 210-4A for ventilation from electronic components (not shown in FIG. 4) in the enclosed space of the stackable shield 299.

The stopper 260 includes a stand 261 and a plate 262 extending inward with respect to the walls 210. As shown, the stopper 260 can be at a corner where two walls join, or can be at an intermediate position on the wall. The plate 262 and the side beam 280 may be in different planes. The planes of the plate 262 and the side beam 280 may have a distance D21 therebetween (FIG. 5). The plates 262 of the stackable frame 200 may be in contact with side beams 280 of another identical stackable frame 200 and stop the two stackable frames 200 from moving deeper into each other, as the two stackable frames 200 interlock with each other. As further illustrated, the ramp 124, 224 can extend the entire width of the beam 122, 222 (FIG. 2A), or can be angled (FIG. 5).

In one example, the stopper 260 is at a wall 210, such as wall 210-3, and the stand 261 is a beam extending along Z axis. In another example, the stopper 260 may be across a boundary between two adjacent walls 210, such as walls 210-3 and 210-2, and the stand 261 include two beams extending along Z axis and forming a right angle between each other. The stackable frame 200 may further include a pick spot 270 for auto-placement during an SMT process. The pick spot 270 may be coupled to one or more of the walls 210 via connection beams 271.

Beam 222 has a first end in contact with one or more walls 210 and a second end in contact with the sloped ramp 224. Stand 261 has a first end in contact with one or more walls 210 and a first end in contact with plate 262. The first ends of the beam 222 and the stand 261 may be connected to and integrated with each other. The integrated first ends of the beam 222 and the stand 261 are offset with respect to the walls 210 by a distance D22 in X-Y plane, and the beam 222 and the stand 261 are offset with respect to the location of the wall 110 by a distance D22 in X-Y plane. Accordingly, the spring fingers 220 of the stackable frame 200 may surround respective outside surfaces of walls 210 of another identical stackable frame 200, as the two stackable frames 200 interlock with each other. FIG. 5 best illustrates that the fingers 220 are longer in length than the stoppers 260, though other embodiments can be provided.

Figure 7:
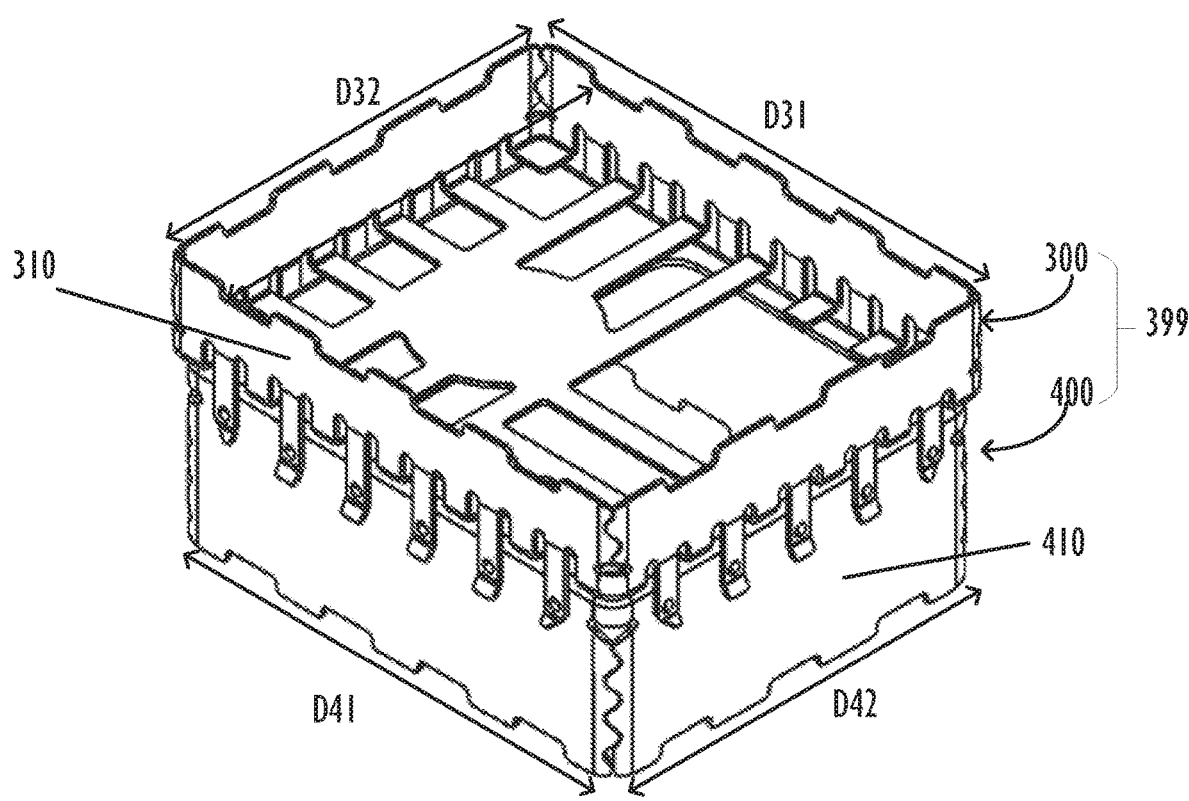
FIG. 7 illustrate a perspective view of another exemplary stackable shield including two stackable frames.

FIG. 7 illustrates a perspective view of another exemplary stackable shield including two stackable frames 300, 400. The stackable shield 399 includes two non-identical stackable frames 300 and 400 coupled to each other to form a singular enclosed space in the stackable shield 399. The stackable frames 300 and 400 join together and form a common ground for the stackable frames 300 and 400.

Figure 8:
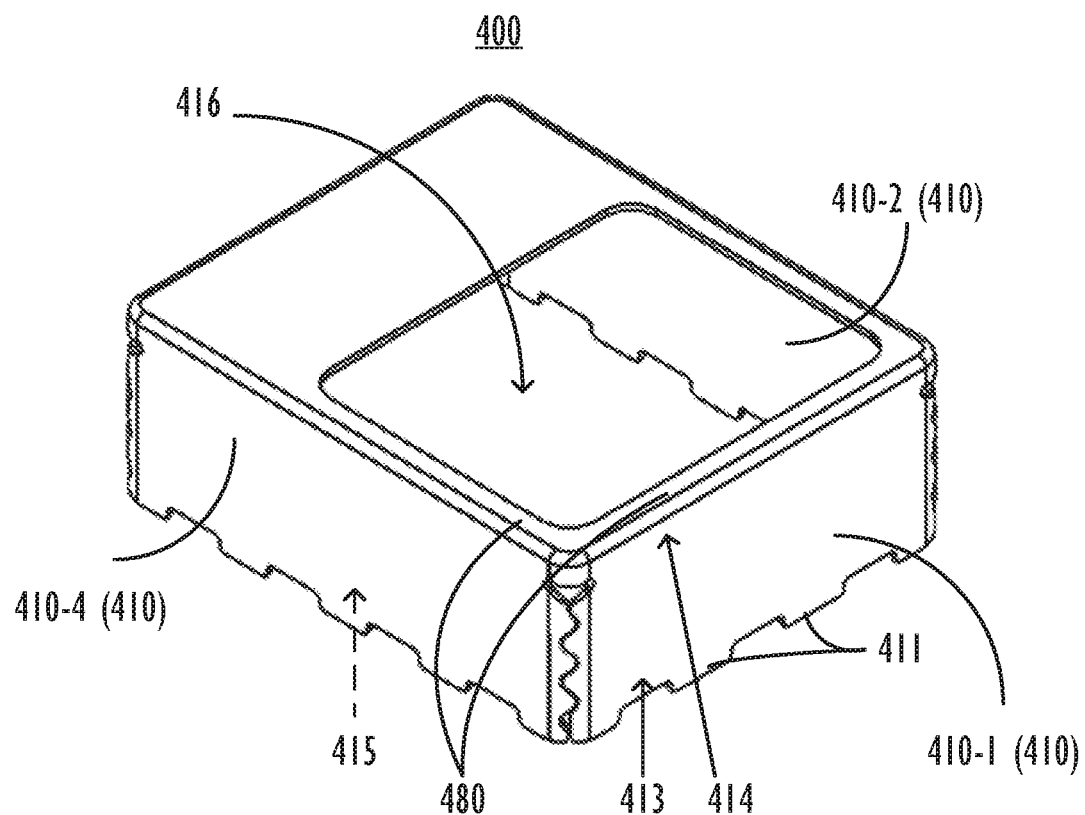
FIG. 8 illustrates a perspective view of a stackable frame shown in FIG. 7.
Figure 9:
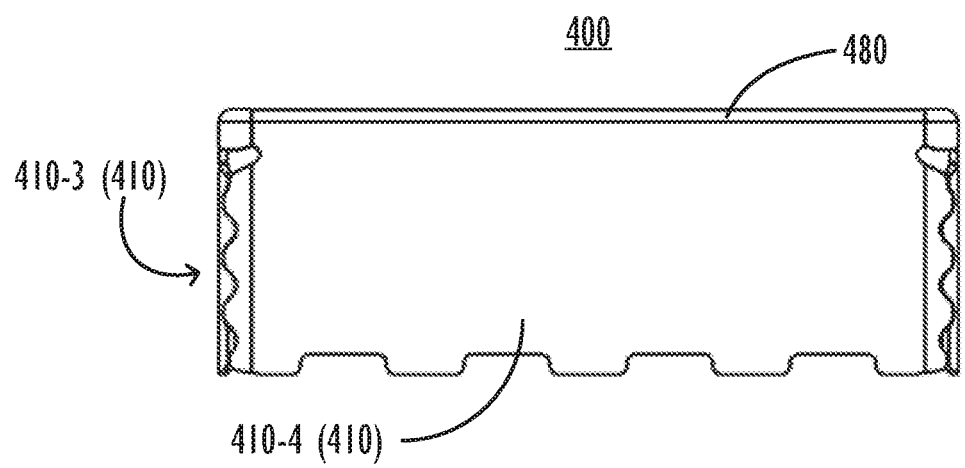
FIG. 9 illustrates a front view of the stackable frame shown in FIG. 8.

FIG. 8 illustrates a perspective view of the stackable frame 400, and FIG. 9 illustrates a front view of the stackable frame 400. The stackable frame 400 includes a plurality of walls 410-1, 410-2, 410-3, and 410-3 and a lid or cover 480. The plurality of walls 410-1, 410-2, 410-3, and 410-4 can also be collectively referred to as walls 410. The lid or cover 480 extends over the open top of the frame 400 and at least partially covers the open top. The top opening 416 is formed in the cover 480. Accordingly, the frame 400 can be interlocked with another frame that is smaller in size, including having a smaller length and width, than the frame shown. The top side of the frame 400 is its mating side with another frame. There are no spring fingers at the top side of the frame 400. In one embodiment, the frame 400 can be interlocked with another frame that has spring fingers to surround the frame 400, such as the frame 300 in FIG. 10. Or a cover or lid can be attached at the opening 416 of the frame 400.

Each wall 410 may include a first end 413 and a second end 414, e.g., a bottom end and a top end. The first ends 413 of the plurality of walls 410 surround at least one first or bottom opening 415, and the second ends 414 of the plurality of walls 410 surround at least one second or top opening 416.

The stackable frame 400 may further include a plurality of solder feet 411 at a first end 413 of each wall 410. The plurality of solder feet 411 may be coupled to a printed circuit board (PCB) by soldering.

Figure 10:
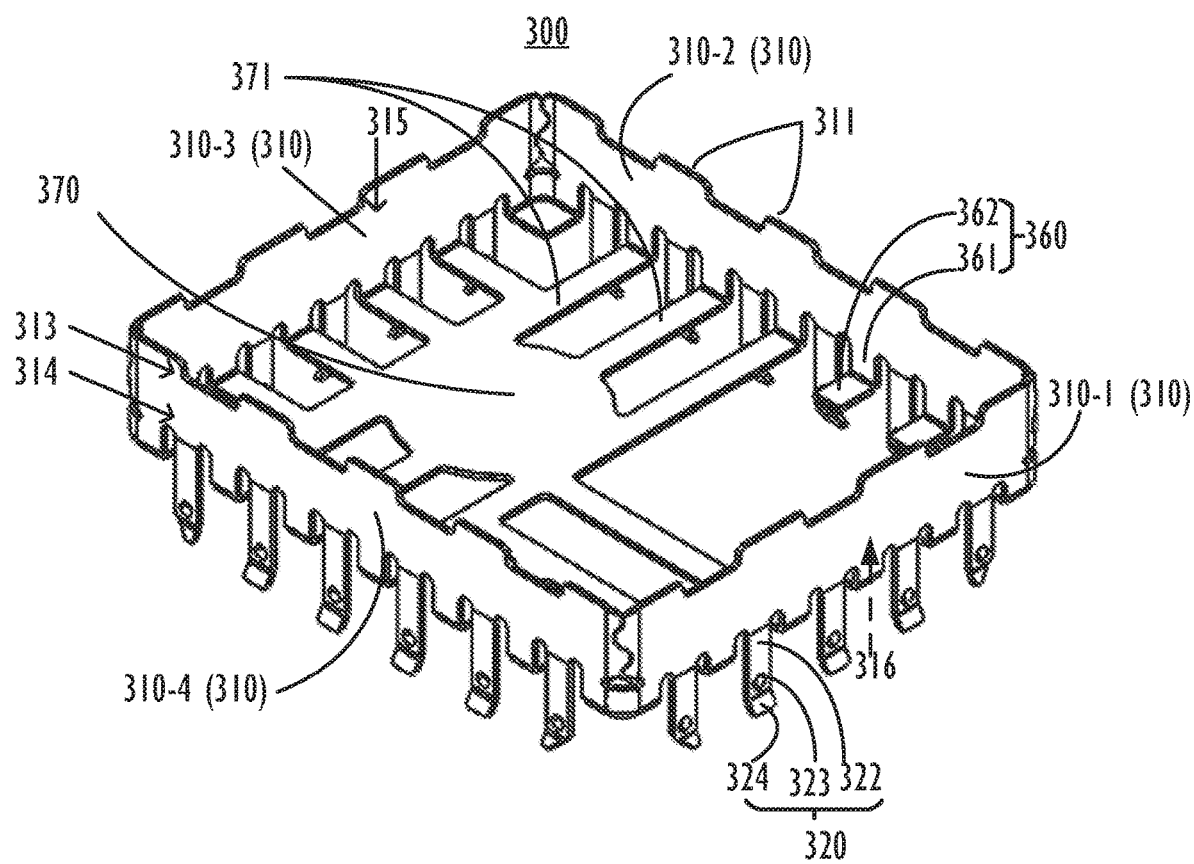
FIG. 10 illustrates a perspective view of another stackable frame shown in FIG. 7.
Figure 11:
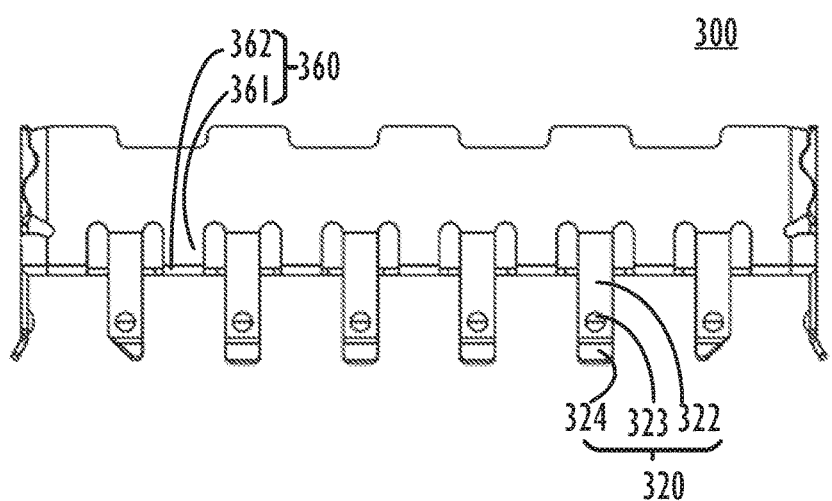
FIG. 11 illustrates a front view of the stackable frame shown in FIG. 10.
Figure 12:
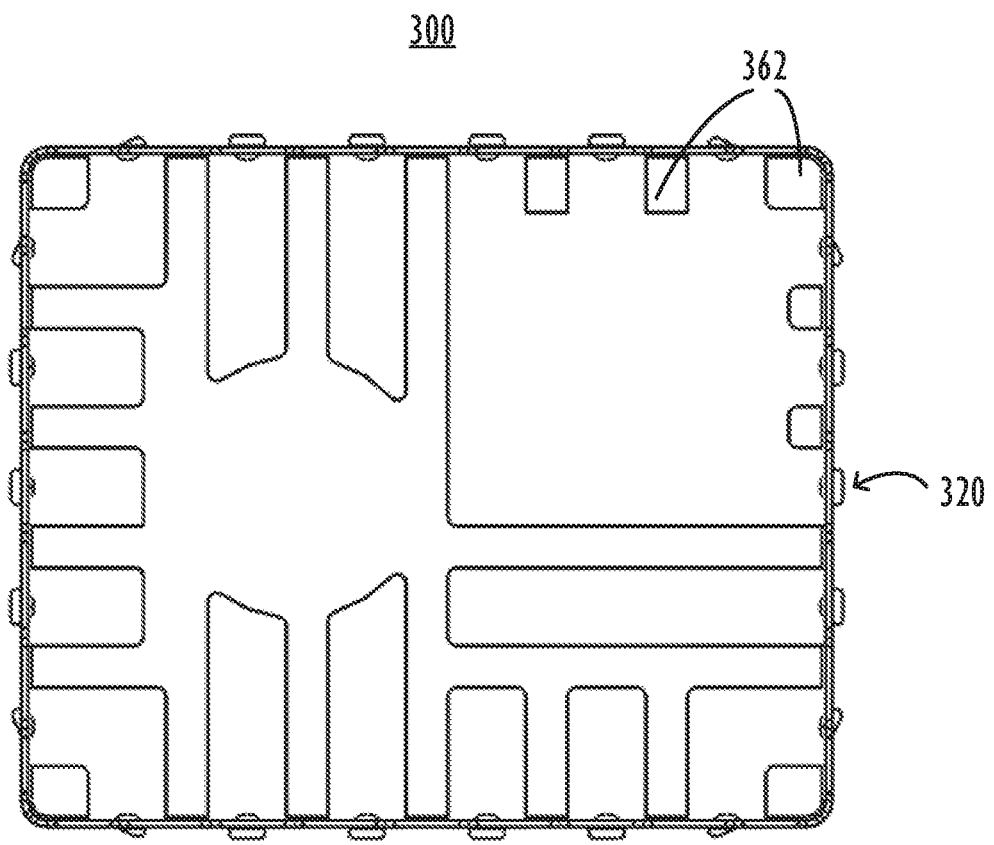
FIG. 12 illustrates a top view of the stackable frame shown in FIG. 10.

FIG. 10 illustrates a perspective view of the stackable frame 300, and FIGS. 11, 12 illustrate a front view and a top view of the stackable frame 300, respectively. The stackable frame 300 includes a plurality of walls 310-1, 310-2, 310-3, and 310-4, a plurality of spring fingers 320, a plurality of stoppers 360, and a pick spot 370. The plurality of walls 310-1, 310-2, 310-3, and 310-3 can also be collectively referred to as walls 310. One difference between the component in FIGS. 10-12 and prior embodiments is that the component is not designed for self-stacking, but rather can be stacked with a mating component that doesn't have any fingers. The spring fingers are all encompassed on this component, and the mating component has no spring fingers at all. Thus, not all stacking shields must have a self-stacking design in which all components are identical (e.g., all components have regions with spring fingers and regions without spring fingers that mate with the spring fingers from a mating component), but rather some can use two different components (e.g., one with spring fingers and one without but that have regions which receive or engage the spring fingers).

Each wall 310 may include a first end 313 and a second end 314. The stackable frame 300 may further include a plurality of solder feet 311 at a first end of each wall 310. The first ends 313 of the plurality of walls 310 surround at least one first opening 315, and the second ends 314 of the plurality of walls 310 surround at least one second opening 316.

The plurality of solder feet 311 may be coupled to a printed circuit board (PCB) by soldering. The plurality of spring fingers 320 are on the second ends of four walls 310-1, 310-2, 310-3, and 310-4. With the spring fingers 320 on the second ends of the four walls 310-1, 310-2, 310-3, and 310-4, the stackable frame 300 may be interlocked with a different stackable frame that has no spring finger, such as the stackable frame 400.

The spring finger 320 include a beam 322, a detent 323, and a sloped ramp 324. The detent 323 is formed at the beam 322, and projects inward with respect to the walls 310, e.g. toward the inner space surrounded by the walls 310. The sloped ramp 324 is on the beam 322, and is tilted outward with respect to the walls 310, e.g., toward the space outside the walls 310. With the guide of the sloped ramps 324, the spring fingers 320 of the stackable frame 300 may smoothly couple with respective walls 410 of the stackable frame 400, as the two stackable frames 300 and 400 interlock with each other. The stopper 360 includes a stand 361 and a plate 362 extending inward with respect to the walls 310.

The plates 362 of the stackable frame 300 may be in contact with the cover 480 of the stackable frame 400 and stop the two stackable frames 300 and 400 from moving deeper into each other, as the two stackable frames 300 and 400 interlock with each other.

The pick spot 370 may be for auto-placement during an SMT process. The pick spot 370 may be coupled to one or more of the walls 310 via connection beams 371.

In some examples, referring to FIG. 7, the dimensions D31 and D32 between the plurality of walls 310 may be larger than the dimensions D41 and D42 between the plurality of walls 410. Accordingly, the spring fingers 320 at the second ends of the walls 310 of the stackable frame 300 may surround and in contact with respective outside surfaces of walls 410 of the stackable frame 400, as the two stackable frames 300 and 400 interlock with each other.

In some other examples, the dimensions D31 and D32 between the plurality of walls 310 may be equal to or close to the dimensions D41 and D42 between the plurality of walls 410. The spring fingers 320 at the second ends of the walls 310 of the stackable frame 300 may surround respective outside surfaces of walls 410 of the stackable frame 400 with spring flexibility of the spring fingers 320, as the two stackable frames 300 and 400 interlock with each other.

Figure 13:
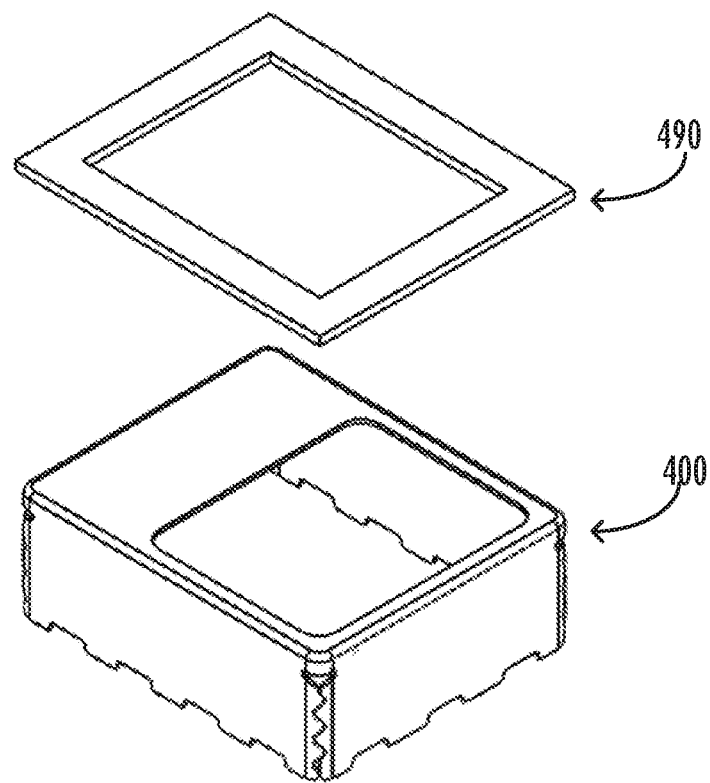
FIG. 13 illustrates perspective views of a stackable frame and a gasket.
Figure 14:
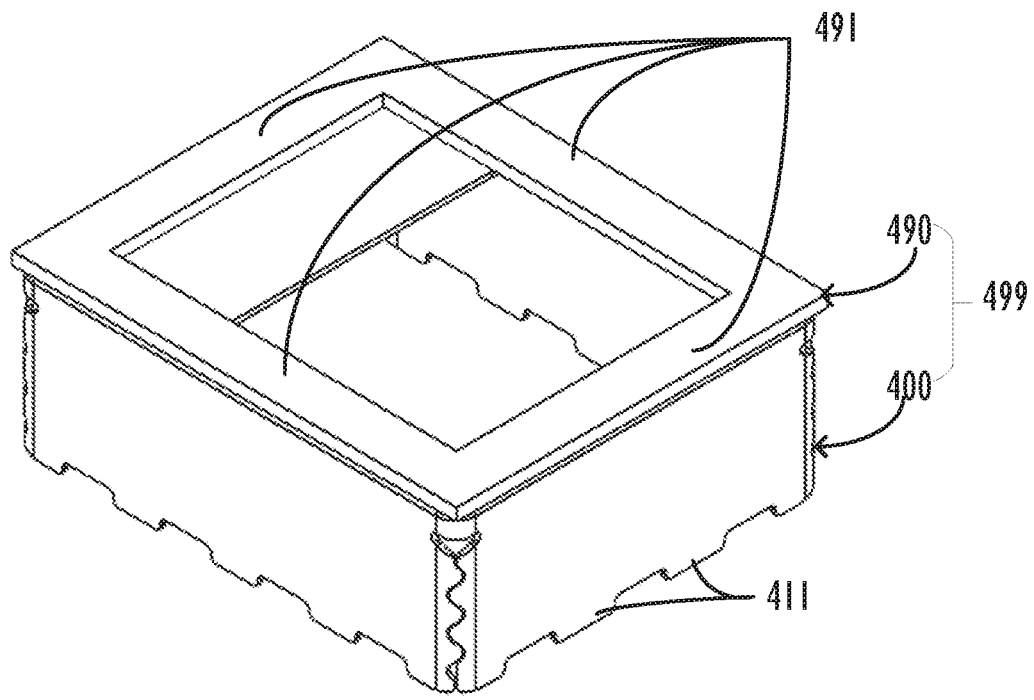
FIG. 14 illustrates a perspective view of another exemplary stackable shield including the stackable frame and the gasket shown in FIG. 13.
Figure 15:
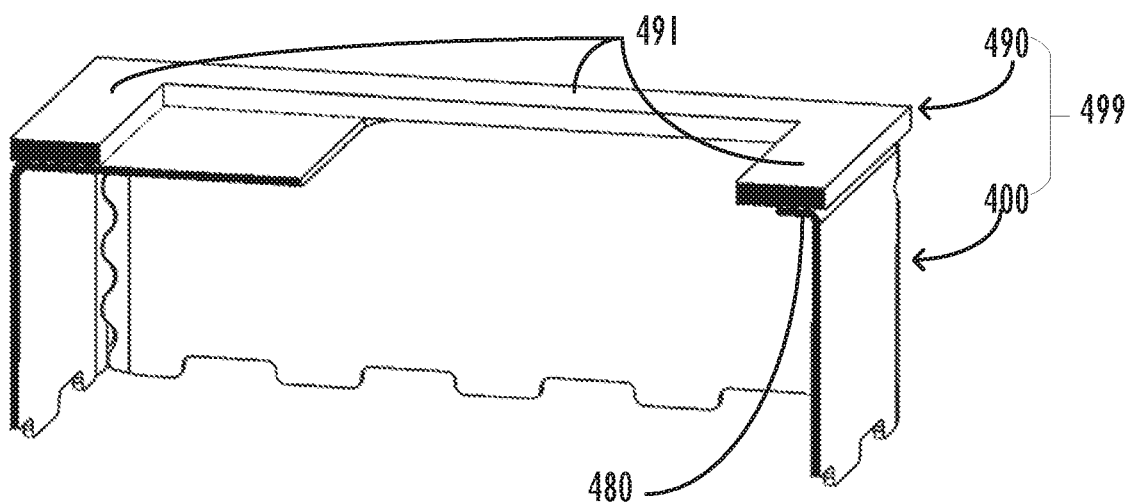
FIG. 15 illustrates a perspective view of a portion of the stackable shield shown in FIG. 14.

FIG. 13 illustrates perspective views of a stackable frame and a gasket. FIG. 14 illustrates a perspective view of another exemplary stackable shield including the stackable frame and the gasket shown in FIG. 13. FIG. 15 illustrates a perspective view of a portion of the stackable shield in FIG. 14. Referring to FIGS. 13-15, the stackable shield 499 includes a stackable frame 400 and a gasket 490. References can made to the above-descriptions of the stackable frame 400, which are not repeated here. The gasket 490 of the stackable shield 499 includes four portions 491 in contact with the cover 480 of the stackable frame 400. The plurality of solder feet 411 may be mounted to a PCB by soldering. The second ends 414 of the stackable frame 400 may be coupled to another PCB via the gasket 490, by compressing the gasket 490 between the stackable frame 400 and the PCB, so as to form a singular enclosed space enclosed in the stackable shield 499.

The gasket 490 may be a thermal pad. The thermal pad may have electrical properties for providing an electrical grounding for the stackable shield 499. A thermal pad may include a material that conducts heat between two other components by providing an interface with a lower thermal resistance than air.

A stackable frame may be mounted to a PCB by soldering solder feet to a PCB, by using thermally conductive adhesive to couple the stackable frame with the PCB, by using a gasket to couple the stackable frame with the PCB, or by using a thermal/electrical paste to couple the stackable frame with the PCB. For example, one end of a stackable frame may be mounted to a PCB by using thermally conductive adhesive, and the other end of the stackable frame may be mounted to another PCB by using a gasket. A thermally conductive adhesive may be, for example, a pad that is adhesive and thermally conductive. A thermal/electrical paste may be, for example, a paste that is electrically conductive and thermally conductive, which conducts heat between two other components by providing an interface with a lower thermal resistance than air.

The thermal pad and thermal adhesive join two surfaces and creates a thermal bond between them. Generally, those objects are an electronic component which is producing heat and a nearby heat sink into which the heat dissipates. The presence of the thermal pad or thermally conductive adhesive on or near the electronic components lowers their operating temperature and improves the overall performance of the device by spreading their heat into the stackable frame.

Figure 16:
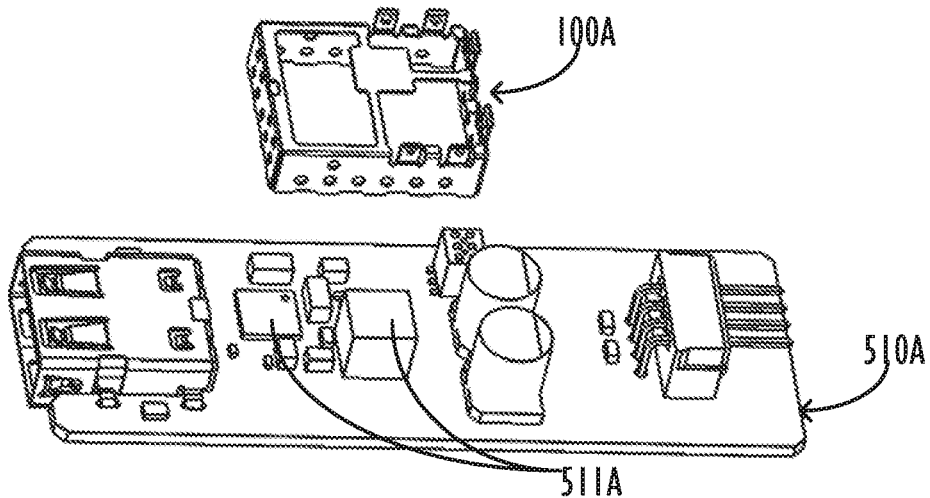
FIGS. 16 to 19 illustrate an exemplary process of assembling a stackable shield.
Figure 17:
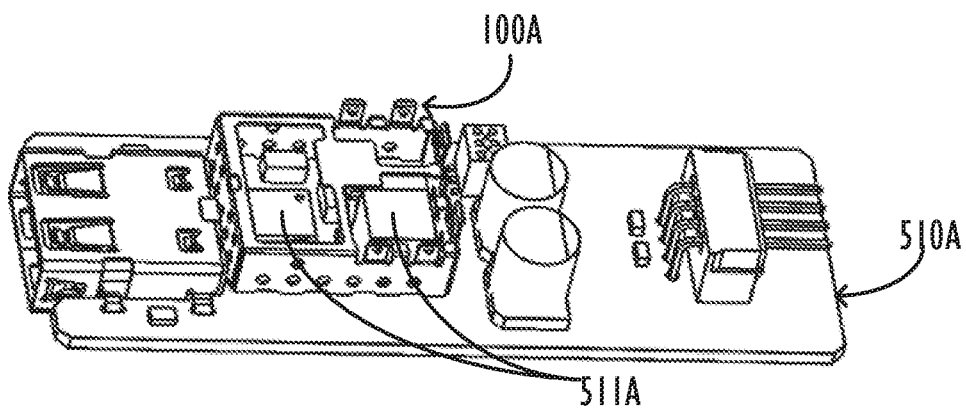

FIGS. 16-19 illustrate an exemplary process of assembling a stackable shield. Referring to FIGS. 16-17, a first stackable frame 100a is mounted to a first PCB 510a, and at least partially encloses one or more first electrical devices 511a on the first PCB 510a. Similarly, a separate second stackable frame 100b may be mounted to a separate second PCB 510b, and at least partially encloses one or more separate second electrical devices 511b on the PCB 510b. The frames 100a, 100b can be mounted to the respective PCB 510a, 510b in any suitable manner, such as by solder or adhesive. As shown, each frame 100a, 100b has a size and shape slightly larger than the one or more respective electrical devices 511a, 511b that it surrounds. Since most electrical devices are relatively flat to the PCB, the frame 100 is also relatively short to provide a low profile. The frames 510a, 510b can be configured in accordance with any of the embodiments discussed above, or other suitable embodiments. For example, the frames 510 need not lock together by detents and lock holes, and other locking mechanisms can be provided. However, in the example embodiment of FIGS. 15-19, the frame 510a, 510b are similar to those shown in FIGS. 1-2 for purposes of illustrating the disclosure.

Figure 18:
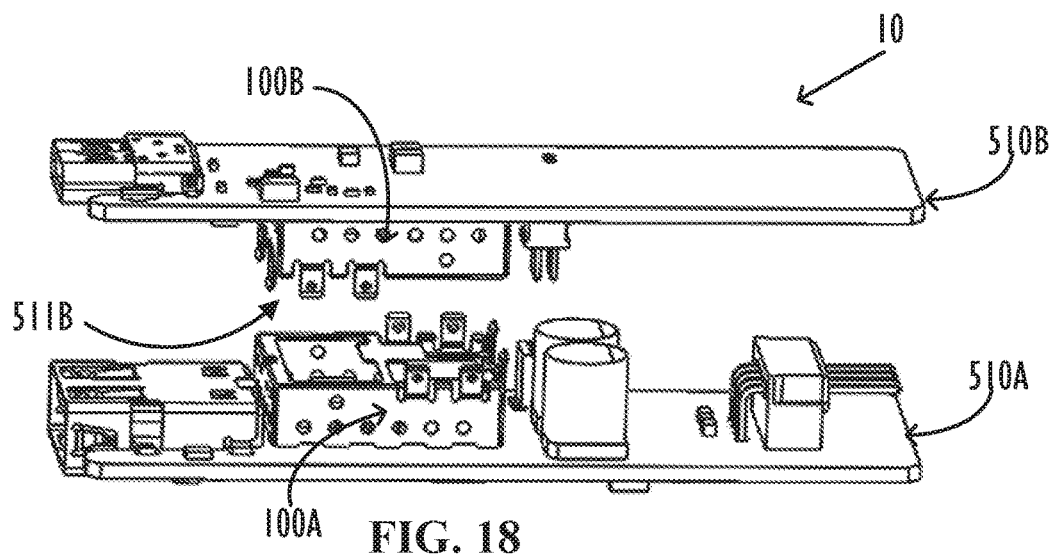

Turning to FIG. 18, the two PCBs 510a, 510b are then aligned to face each other. That is, a first PCB 510a has a first frame 100a on first surface of the PCB 510a, and a second PCB 510b has a second frame 100b on a second surface of the PCB 510b. The first surface faces the second surface, for example as shown the first surface can be upward facing and the second surface can be downward facing. In addition, the second frame 100b can be rotated 180 degrees with respect to the first frame 100a. As shown in the illustrative embodiment of FIG. 18, the first and second frames 100a, 100b are identical to one another, with the spring fingers positioned on the right side of the frames 100a, 100b. However, the second PCB 510b is rotated, so that the fingers for the second frame 100b align with the left side of the first frame 100a. In addition, all board-to-board pin connectors are aligned and the first frame 100a is aligned with the second frame 100b. In that position, a latch of the first frame 100a may mate with a latch hole of the second frame 100b, and a latch of the second frame 100b may mate with a latch hole of the first frame 100a; the fingers and detents of the first frame 100a may be aligned with the lock holes of the second frame 100b, and the fingers and detents of the second frame 100b are aligned with the lock holes of the first frame 100a. In one embodiment, some of ventilation holes of the first and second frames may serve as the lock holes.

Figure 19:
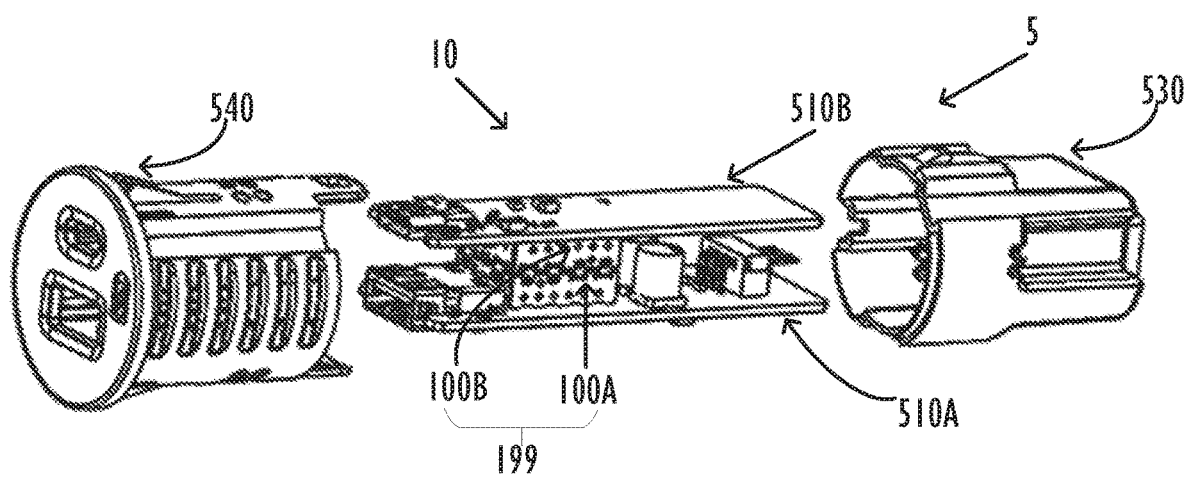

Referring now to FIG. 19, the two PCBs 510a, 510b are then pressed together, and the two stackable frames 100 join together, such as by being locked by the latches mating with the latch holes and/or by the detents entering the lock holes. In that joined or interlocked configuration, the stackable shield 199 forms a common ground for the two stackable frames 100a and 100b and has a single contiguous enclosed space formed by the interior space of each of the respective frame 100a, 100b. The interlocked configuration forms a combined electrical assembly 10 which includes the PCBs 510a, 510b, the frames 100a, 110b, and the electrical devices 511a, 511b. In one embodiment, the electrical devices 511a, 511b can be arranged so that the taller components on the first PCB 510a are opposite the shorter components on the second PCB 510b. That way, when the PCBs 510a, 510b are brought together, the assembly 10 is as thin as possible. It is further noted that the walls of the first frame 100a can be the same height as the walls of the second frame 100b, or can be a different height either longer or shorter than the walls of the second frame 110b.

Referring to FIG. 19, one implementation of the electrical assembly 10 is shown for non-limiting illustrative purposes. Here, the assembly 10 is utilized in a connector 5. The assembly can be, for example, situated between and coupled to a front housing member 540 and a rear housing member 530. The front and rear housing members 540, 530 can at least partially or wholly enclose the assembly 10. In addition, a housing can be placed over the assembly 10 and/or housing members 540, 530 to completely surround or enclose the assembly 10 and at least partially surround or enclose the housing members 540, 530. Electronic components on the PCBs 510a, 510b can communicate with interfaces on the front face of the front housing member 540.

In some examples, a height of certain electrical device of the electrical devices 511 on the PCB 510a is larger than a height of the stackable frame 100a mounted to the PCB 510a, e.g., a distance between the first end 113 and the second end 114 of the stackable frame 100. The certain electrical device 511 on the PCB 510a may extend beyond the stackable frame 100a on the PCB 510a and into the stackable frame 100b mounted to the PCB 510b, but is still enclosed within the stackable shield 199. The singular enclosed space in the stackable shield 199 and between the two PCBs 510a and 510b may accommodate the certain electrical device 511 on the PCB 510a extending beyond one stackable frame 100a. The singular enclosed space may have a height roughly equivalent to a height of the total spacing between the two PCBs 510a and 510b.

The frames 100a and 100b (collectively referred to as frames 100) cooperate to provide an electronic shield to the electronic components 511a, 511b that they surround. Having two frames that interlock avoids the necessity of each frame having its own cover. And, having two frames interlock provides a mechanically stronger structure for the assembly 10, and a single common unified ground. The frames 100a, 100b also provide a more compact assembly 10 than having two separate frames that do not interlock, and permit the PCBs to be located closer to one another. The stackable shield may shield radiated electric and magnetic fields and/or may serve as heat sinks by choosing appropriate materials for the stackable shield according to various application scenarios. Further, the stackable shield may serve as mechanical support between the two PCBs, which may alleviate stress on board-to-board connectors.

It is noted that the disclosure shows and describes two frames 100 that mate together, each having an open bottom and/or top (i.e., without a lid or cover). However, it is noted that one of the frames can have a shield lid. For example in FIG. 19, the bottom frame 100a can have a closed top, such as a lid that extends a portion or the entire length of the frame 100a. The upper frame 100b can have an open bottom, so that the lid separates the lower and upper frames 100a, 100b to provide shielding therebetween.

Accordingly, it was one object to keep the PCB's as close as possible together. The stacking frames 100 do not require or have a shield lid, which require space. By eliminating the lids (i.e., having an open top and/or open bottom), the frames allow the PCBs to be moved closer together to have a small overall package size that is shorter and low-profile, without reducing the size of the electronic components. Of course, it also serves the function of any other EMI shield, by providing interference shielding.

The frames solve the problem of creating an EMI fence for electronics on two separate boards in close proximity where space is limited by providing a singular frame which encompasses both sets of electronics. That eliminates wasted space that would be used by two separate EMI shields. There are two separate contact areas designated for two separate PCBA's. If those contact areas are on separate elements, those elements are attached to each other, such as by the use of the spring fingers or other attachment mechanisms. Other embodiments use a singular "self-stacking" shield which uses only one frame, or using two differently-formed frames, or using only one frame combined with a gasket or adhesive. The frames can also serve as a heat sink for electronic components. It may also serve as mechanical support between the boards which would alleviate stress on board-to-board connectors.

It will be apparent to those skilled in the art having the benefit of the teachings presented in the foregoing descriptions and the associated drawings that modifications, combinations, sub-combinations, and variations can be made without departing from the spirit or scope of this disclosure. Likewise, the various examples described may be used individually or in combination with other examples. Those skilled in the art will appreciate various combinations of examples not specifically described or illustrated herein that are still within the scope of this disclosure. In this respect, it is to be understood that the disclosure is not limited to the specific examples set forth and the examples of the disclosure are intended to be illustrative, not limiting.

As used in this specification and the appended claims, the singular forms "a", "an" and "the" include plural referents, unless the context clearly dictates otherwise. Similarly, the adjective "another," when used to introduce an element, is intended to mean one or more elements. The terms "comprising," "including," "having" and similar terms are intended to be inclusive such that there may be additional elements other than the listed elements.

Additionally, where a method described above or a method claim below does not explicitly require an order to be followed by its steps or an order is otherwise not required based on the description or claim language, it is not intended that any particular order be inferred. Likewise, where a method claim below does not explicitly recite a step mentioned in the description above, it should not be assumed that the step is required by the claim.

It is noted that the description and claims may use geometric or relational terms, such as bottom, top, side, left, right, rectangular, square, parallel, orthogonal, etc. These terms are not intended to limit the disclosure and, in general, are used for convenience to facilitate the description based on the examples shown in the figures. In addition, the geometric or relational terms may not be exact. For instance, walls may not be exactly perpendicular or parallel to one another because of, for example, roughness of surfaces, tolerances allowed in manufacturing, etc., but may still be considered to be perpendicular or parallel.

What is claimed is:

1. A frame, comprising:
a plurality of walls each having a first end and a second end facing away from each other along a first direction; and
a plurality of spring fingers on the second end of one or more walls of the plurality of walls and extending along the first direction;
a latch hole in a side beam on a first wall of the plurality of walls; and
a latch extending along the first direction and from a second wall opposing the first wall;
wherein the first ends of the plurality of walls define an open bottom, and the second ends of the plurality of walls define an open top.

2. The frame of claim 1, wherein a spring finger of the plurality of spring fingers includes:
a beam;
a sloped ramp on the beam; and
a detent at the beam and projecting inward with respect to the plurality of walls.

3. The frame of claim 2, wherein:
the spring finger of the plurality of spring fingers further includes a shift portion between the beam and a second end of a wall, providing a location shift for the beam and outward with respect to the plurality of walls.

4. The frame of claim 1, wherein:
the side beam is a first side beam; and
the frame includes one or more side beams extending from the second ends of one or more walls of the plurality of walls and inward with respect to the plurality of walls, the one or more side beams including the first side beam.

5. The frame of claim 1, wherein the latch includes:
a shift portion;
a beam on the shift portion; and
a sloped ramp on the beam and tilted inward with respect to the plurality of walls; wherein the shift portion provides a location shift for the beam and inward with respect to the plurality of walls.

6. The frame of claim 1, further comprising:
a plurality of ventilation holes penetrating through the plurality of walls.

7. A frame comprising:
a plurality of walls each having a first end and a second end facing away from each other along a first direction, wherein the first ends of the plurality of walls define an open bottom, and the second ends of the plurality of walls define an open top;
a plurality of spring fingers on the second end of one or more walls of the plurality of walls and extending along the first direction;
one or more side beams extending from the second ends of one or more walls of the plurality of walls and inward with respect to the plurality of walls; and
one or more stoppers on the second end of at least one wall of the plurality of walls, wherein each stopper of the one or more stoppers includes a stand and a plate on the stand and extending inward with respect to the plurality of walls.

8. The frame of claim 7, wherein the plate of each stopper of the one or more stoppers is in a same plane as the one or more side beams.

9. The frame of claim 7, wherein the plate of each stopper of the one or more stoppers and the one or more side beams are in different planes.

10. The frame of claim 7, further comprising:
a latch hole in a side beam on a first wall of the plurality of walls; and
a latch extending along the first direction and from a second wall opposing the first wall.

11. A shield, comprising:
a first frame includes:
a plurality of walls each having a first end and a second end facing away from each other along a first direction; and
a plurality of spring fingers on second ends of one or more walls of the plurality of walls and extending along the first direction,
a second frame includes:
a plurality of walls each having a first end and a second end facing away from each other along a first direction, wherein the first ends of the plurality of walls define an open bottom, and the second ends of the plurality of walls define an open top;
wherein the second frame interlocks with the first frame to form a singular enclosed space in the shield, with second ends of the plurality of walls of the second frame oriented toward second ends of the plurality of walls of the first frame.

12. The shield of claim 11, further comprising:
a first printed circuit board (PCB) having a first surface and a second PCB having a second surface, said first frame mounted to the first surface of said first PCB and said second frame mounted to the second surface of said second PCB, wherein the first surface faces the second surface.

13. The shield of claim 11, wherein a spring finger of the plurality of spring fingers of the first frame includes:
a beam;
a sloped ramp on the beam; and
a detent at the beam and projecting inward with respect to the plurality of walls,
wherein the detent of the first frame is in contact with a wall of the plurality of walls of the second frame.

14. The shield of claim 13, wherein:
the spring finger of the plurality of spring fingers of the first frame further includes a shift portion between the beam and a second end of a wall of the first frame, providing a location shift for the beam and outward with respect to the plurality of walls.

15. The shield of claim 11, further comprising:
one or more side beams extending from second ends of one or more walls of the plurality of walls of the first frame and inward with respect to the plurality of walls.

16. The shield of claim 15, further comprising:
one or more stoppers on a second end of at least one wall of the plurality of walls of the first frame, wherein each stopper of one or more stoppers includes a stand and a plate on the stand and extending inward with respect to the plurality of walls.

17. The shield of claim 16, wherein the plate of each of the one or more stoppers is in a same plane as the one or more side beams.

18. The shield of claim 16, wherein the plate of each of the one or more stoppers and the one or more side beams are in different planes.

19. The shield of claim 11, further comprising:
a latch hole in a side beam on a first wall of the plurality of the walls of the first frame; and
a latch extending along the first direction and from a second wall of the first frame opposing the first wall.

20. The shield of claim 19, wherein the latch includes:
a shift portion;
a beam on the shift portion; and
a sloped ramp on the beam and tilted inward with respect to the plurality of walls of the first frame; wherein the shift portion provides a location shift for the beam and inward with respect to the plurality of walls of the first frame.

21. The frame of claim 11, further comprising:
a plurality of ventilation holes penetrating through the plurality of walls of the first frame.

\* \* \* \* \*